United States Patent
Hang et al.

(10) Patent No.: US 9,076,919 B2
(45) Date of Patent: *Jul. 7, 2015

(54) PROCESS OF FORMING AN ALUMINUM P-DOPED SURFACE REGION OF A SEMICONDUCTOR SUBSTRATE

(71) Applicant: E I DU PONT DE NEMOURS AND COMPANY, Wilmington, DE (US)

(72) Inventors: Kenneth Warren Hang, Hillsborough, NC (US); Alistair Graeme Prince, Bristol (GB); Michael Rose, South Gloucestershire (GB); Richard John Sheffield Young, Somerset (GB)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 96 days.

This patent is subject to a terminal disclaimer.

(21) Appl. No.: 13/667,047

(22) Filed: Nov. 2, 2012

(65) Prior Publication Data
US 2013/0112250 A1  May 9, 2013

Related U.S. Application Data

(60) Provisional application No. 61/555,516, filed on Nov. 4, 2011.

(51) Int. Cl.
| | | |
|---|---|---|
| *H01L 21/44* | (2006.01) | |
| *H01L 31/18* | (2006.01) | |
| *H01L 21/22* | (2006.01) | |
| *H01L 21/225* | (2006.01) | |
| *H01L 31/06* | (2012.01) | |
| *H01L 31/0224* | (2006.01) | |

(52) U.S. Cl.
CPC ........ *H01L 31/1804* (2013.01); *H01L 21/2205* (2013.01); *H01L 21/2254* (2013.01); *H01L 31/06* (2013.01); *H01L 31/022425* (2013.01); *H01L 31/02245* (2013.01); *Y02E 10/547* (2013.01)

(58) Field of Classification Search
CPC .............. H01L 31/022425; H01L 31/1804; H01L 31/068; H01L 31/022441; H01L 31/202; H01L 31/075; H01L 31/03921; H01L 31/03682; H01L 21/02532; H01L 21/76843; H01L 21/76877; H01L 23/53223; H01L 23/53219; H01L 21/76882; Y02E 10/548; Y02E 10/50
USPC .............................................. 438/96, 97, 688
See application file for complete search history.

(56) References Cited

U.S. PATENT DOCUMENTS

| | | | |
|---|---|---|---|
| 2005/0268963 A1* | 12/2005 | Jordan et al. .................. | 136/256 |
| 2006/0231802 A1* | 10/2006 | Konno .......................... | 252/500 |

OTHER PUBLICATIONS

Clement et al, Industrially feasible multi-crystalline metal wrap through (MWT) silicon solar cells exceeding 16% efficiency, Solar Energy Materials & Solar Cells 93 (2009), pp. 1051-1055).
Solland Preliminary Datasheet Sunweb downloaded from website http://www.sollandsolar.com/IManager/Content/4680/qfl7/mt1537/mi30994/mu1254913665/mv2341.

* cited by examiner

*Primary Examiner* — Michelle Mandala

(57) ABSTRACT

A process for the formation of at least one aluminum p-doped surface region of a semiconductor substrate comprising the steps:
(1) providing a semiconductor substrate,
(2) applying and drying an aluminum paste on at least one surface area of the semiconductor substrate,
(3) firing the dried aluminum paste, and
(4) removing the fired aluminum paste with water,
wherein the aluminum paste employed in step (2) includes particulate aluminum, an organic vehicle and 3 to 20 wt. % of glass frit, based on total aluminum paste composition.

12 Claims, No Drawings

PROCESS OF FORMING AN ALUMINUM P-DOPED SURFACE REGION OF A SEMICONDUCTOR SUBSTRATE

FIELD OF THE INVENTION

The invention is directed to a process of forming an aluminum p-doped surface region of a semiconductor substrate and to semiconductor substrates made by said process.

TECHNICAL BACKGROUND OF THE INVENTION

In the description and the claims the term "aluminum p-doped" is used. It means p-doped with aluminum as the p-dopant.

The p-doping of silicon by thermal diffusion of a p-dopant like boron into a silicon substrate is well-known. Thermal diffusion is typically carried out using a diffusion source of the p-dopant, for example, gaseous $BBr_3$. The p-dopant may be thermally diffused throughout the entire silicon substrate thus forming a p-doped silicon substrate (p-type silicon substrate). However, it is also possible for the thermal diffusion process to be carried out in a manner which allows the p-dopant to penetrate only into a surface region of the silicon substrate thus forming only a thin p-doped layer with a low penetration depth of, for example, up to 200 nm. Said thermal diffusion process can be supported by masking certain portions of the silicon substrate surface, i.e. those surface areas which shall not receive the p-dopant.

A solar cell is a particular example of a semiconductor.

A conventional solar cell structure consists of a p-type base with a front n-type surface (front n-type region, front n-type emitter), a negative electrode that is deposited on the front-side (illuminated side, illuminated surface) of the cell and a positive electrode on the back-side. Typically, the p-type base with the front n-type surface is p-type silicon with a front n-type silicon surface.

The production of a conventional solar cell typically starts with a p-type substrate in the form of a p-type wafer, typically a p-type silicon wafer. The p-type wafer may have an area in the range of, for example, 100 to 250 cm² and a thickness of, for example, 180 to 300 μm. On the p-type wafer an n-type diffusion layer, i.e. an n-type emitter, is formed by the thermal diffusion of phosphorus (P) or the like. Phosphorus oxychloride ($POCl_3$) is commonly used as the gaseous phosphorus diffusion source, other liquid sources are phosphoric acid and the like. In the absence of any particular modification, the n-type diffusion layer is formed over the entire surface of the p-type substrate. The p-n junction is formed where the concentration of the p-dopant equals the concentration of the n-dopant; conventional cells that have the p-n junction close to the illuminated side, have a junction depth between 0.05 and 0.5 μm.

After formation of this diffusion layer excess surface glass is removed from the rest of the surfaces by etching by an acid such as hydrofluoric acid.

Next, an ARC layer (antireflective coating layer) of, for example, $TiO_x$, $SiO_x$, $TiO_x/SiO_x$, $SiN_x$, $Si_3N_4$ or, in particular, a dielectric stack of $SiN_x/SiO_x$ is formed on the n-type diffusion layer to a thickness of, for example, 50 to 100 nm by a process, such as, for example, plasma CVD (chemical vapor deposition).

The front cathode is typically applied by screen printing and drying a front-side conductive metal paste (front electrode forming conductive metal paste), typically a silver paste, on the ARC layer on the front-side of the wafer. The front cathode is typically screen printed in a so-called H pattern which includes (i) thin parallel finger lines (collector lines) and (ii) two busbars intersecting the finger lines at right angle. In addition, a back-side conductive metal paste, typically a silver or silver/aluminum paste, and a back-side aluminum paste are screen printed (or some other application method) and successively dried on the back-side of the wafer. Normally, the back-side conductive metal paste is screen printed onto the wafer's back-side first as two parallel busbars or as rectangles (tabs) ready for soldering interconnection strings (presoldered copper ribbons). The back-side aluminum paste is then printed in the bare areas with a slight overlap over the back-side conductive metal. Firing is then typically carried out in a belt furnace for a period of 1 to 5 minutes with the wafer reaching a peak temperature in the range of 700 to 900° C. The front cathode and the back anodes can be fired sequentially or cofired.

The aluminum paste is generally screen printed and dried on the back-side of the wafer. The wafer is fired at a temperature above the melting point of aluminum; in the typical case of a silicon wafer an aluminum-silicon melt is formed and, subsequently, during the cooling phase, an epitaxially grown layer of silicon is formed that is doped with aluminum. This layer is generally called the BSF (back surface field) layer. The aluminum paste is transformed by firing from a dried state to an aluminum back anode. The back-side conductive metal paste is fired at the same time, becoming a conductive metal back anode. During firing, the boundary between the back-side aluminum and the back-side conductive metal assumes an alloy state, and is connected electrically as well. The aluminum anode accounts for most areas of the back anode, owing in part to the need to form a p+ layer. A conductive metal back anode is formed over portions of the back-side (often as 2 to 6 mm wide busbars) as an electrode for interconnecting solar cells by means of presoldered copper ribbon or the like. In addition, the front-side conductive metal paste printed as front-side cathode sinters and penetrates through (fires through) the ARC layer during firing, and is thereby able to electrically contact the n-type layer.

The wafer and the aluminum back anode together form a bimetallic strip which tends to exhibit warpage (bowing), an undesired behavior, particularly undesired if the bowing exceeds a tolerable upper limit.

MWT (metal-wrap-through) solar cells represent a special type of the aforedescribed conventional solar cells. They have another cell design and they are also well-known to the skilled person (cf. for example, the website "http://www.sollandsolarcom/IManager/Content/4680/qfl7/mt1537/mi30994/mu1254913665/mv2341" and the leaflet "Preliminary Datasheet Sunweb" which can be downloaded from that website and F. Clement et al., "Industrially feasible multi-crystalline metal wrap through (MWT) silicon solar cells exceeding 16% efficiency", Solar Energy Materials & Solar Cells 93 (2009), pages 1051-1055). MWT solar cells are back contact cells allowing for less front-side shadowing than standard solar cells.

The p-type wafers of MWT solar cells are provided with small holes forming vias between the front- and the back-side of the cell. MWT solar cells have an n-type emitter extending over the entire front-side and the inside of the holes. The n-type emitter is covered with a dielectric passivation layer which serves as an ARC layer. Whereas the n-type emitter extends not only over the entire front-side but also over the inside of the holes, the dielectric passivation layer does not and leaves out the inside of the holes. The inside of the holes, i.e. the n-type diffusion layer not covered with the dielectric passivation layer, is provided with a metallization. The metallizations of the holes serve as emitter contacts and form cathodic back contacts of the MWT solar cell. In addition, the front-side of the MWT solar cell is provided with a front-side metallization in the form of thin conductive metal collector lines which are arranged in a pattern typical for MWT solar cells, for-example, in a grid- or web-like pattern or as thin parallel finger lines. The term "pattern typical for MWT solar cells" means that the terminals of the collector lines overlap with the metallizations of the holes and are thus electrically connected therewith. The collector lines are applied from a conductive metal paste and they are fired through the front-side dielectric passivation layer thus making contact with the front n-type surface of the cell.

Like the back-side of a conventional solar cell, the back-side of a MWT solar cell is also provided with a back-side metallization in the form of an aluminum anode. This aluminum anode is in electric connection with conductive metal collector back contacts, whereby the aluminum anode as well as the conductive metal collector back contacts are in any case electrically insulated from the metallizations of the holes. The photoelectric current is collected from the cathodic back contacts and the anodic conductive metal collector back contacts of the MWT solar cell.

The production of a MWT solar cell is quite similar to the aforedescribed production of a conventional solar cell and it starts with a p-type wafer, typically a p-type silicon wafer. Small holes forming vias between the front- and the back-side of the wafer are applied, typically by laser drilling. The holes so produced are evenly distributed over the wafer and their number lies in the range of, for example, 10 to 100 per wafer. Then an n-type diffusion layer (n-type emitter) is formed over the entire front-surface of the substrate including the inside of the holes.

After formation of the n-type diffusion layer, excess surface glass is removed from the emitter surface by etching, in particular, in a strong acid like, for example, hydrofluoric acid.

Typically, a dielectric ARC layer, for example, of $TiO_x$, $SiO_x$, $TiO_x/SiO_x$, $SiN_x$, $Si_3N_4$ or, in particular, a dielectric stack of $SiN_x/SiO_x$ is then formed on the front-side n-type diffusion layer leaving out however the inside of the holes and, optionally, also a narrow rim around the front-side edges of the holes. Deposition of the dielectric may be performed, for example, using a process such as plasma CVD (chemical vapor deposition) or sputtering.

Just like the aforedescribed conventional solar cell structure, MWT solar cells typically have a cathode on their front-side and an anode on their back-side. The front cathode takes the form of thin conductive collector lines arranged in a pattern typical for MWT solar cells. The thin conductive collector lines are typically applied by screen printing, drying and firing a front-side conductive metal paste, typically a silver paste, on the ARC layer on the front-side of the cell, whereby the terminals of the collector lines overlap with the metallizations of the holes to enable electric connection therewith. Firing is typically carried out in a belt furnace for a period of 1 to 5 minutes with the wafer reaching a peak temperature in the range of 700 to 900° C.

As already mentioned, the holes of the wafers of the MWT solar cells are provided with metallizations. To this end, the holes themselves are metallized by applying conductive metal paste, typically silver paste, to the holes, either in the form of a conductive metal layer (open holes) or in the form of conductive metal plugs (holes filled with conductive metal). The metallizations may cover only the inside of the holes or also a narrow rim around the edges of the holes, whereby the narrow rim may be present on the front-side edges of the holes, on the back-side edges of the holes or on both. The metallizations may be applied from one single conductive metal paste. It is also possible to apply the metallizations from two different conductive metal pastes, i.e. one conductive metal paste may be applied to the front-side of the holes and the other to their back-side. After application of the one or two conductive metal pastes it is/they are dried and fired to form n-type emitter contacts and, respectively, cathodic back contacts of the MWT solar cell. Firing is typically carried out in a belt furnace for a period of 1 to 5 minutes with the wafer reaching a peak temperature in the range of 700 to 900° C. The fired metallizations of the holes are in electric connection with the terminals of the thin front-side conductive collector lines.

In addition, a back-side conductive metal paste, typically a silver or silver/aluminum paste, and an aluminum paste are applied, typically screen printed, and successively dried on the back-side of the p-type wafer avoiding any contact with the metallizations of the holes. In other words, the back-side metal pastes are applied ensuring that they stay electrically insulated from the metallizations of the holes prior to as well as after firing. The back-side conductive metal paste is applied onto the back-side as anodic back collector contacts, which may take the form of busbars, tabs or evenly distributed contacts. The back-side aluminum paste (for BSF formation) is then applied in the bare areas slightly overlapping with the conductive metal back collector contacts. In some cases, the back-side conductive metal paste is applied after the back-side aluminum paste has been applied. Firing is typically carried out in a belt furnace for a period of 1 to 5 minutes with the wafer reaching a peak temperature in the range of 700 to 900° C. The front cathode, the metallizations of the holes and the back anodes can be fired sequentially or cofired.

SUMMARY OF THE INVENTION

It has been found that an aluminum p-doped surface region of a semiconductor substrate can be produced by applying and firing an aluminum paste on the surface of a semiconductor substrate and subsequent removal of the fired aluminum composition by treatment with water, provided the aluminum paste includes 3 to 20 wt. % (weight-%) of glass frit, based on total aluminum paste composition.

In the description and the claims the term "semiconductor substrate" is used. It means thin semiconductor wafers, in particular, solar cell wafers. To avoid misunderstandings, it does not include thick substrates like, for example, crystalline silicon ingots.

The invention relates to a process for the formation of at least one aluminum p-doped surface region of a semiconductor substrate. Accordingly, it relates also to a process for the production of the semiconductor substrate itself which has the at least one aluminum p-doped surface region. Therefore, in its general embodiment, the process of the invention includes the steps:

(1) providing a semiconductor substrate,
(2) applying and drying an aluminum paste on at least one surface area of the semiconductor substrate,
(3) firing the dried aluminum paste, and
(4) removing the fired aluminum paste with water, wherein the aluminum paste employed in step (2) includes particulate aluminum, an organic vehicle and 3 to 20 wt. % of glass frit, based on total aluminum paste composition.

DETAILED DESCRIPTION OF THE INVENTION

In the description and the claims the term "aluminum p-doped surface region of a semiconductor substrate" is used.

It is not limited to a surface area of a semiconductor substrate where the aluminum p-dopant can only be found at the very surface; rather, it means a surface area of a semiconductor substrate where the aluminum p-dopant has penetrated the surface in the respective area only to a certain penetration depth in the range of, for example, 500 to 4000 nm, in particular, 3000 to 4000 nm; in other words, the aluminum p-dopant forms a thin aluminum p-doped surface layer in the respective area. In any case the aluminum p-dopant has not penetrated throughout the entire semiconductor substrate.

In the description and the claims the term "at least one surface area of a semiconductor substrate" is used. It means either the entire surface area or only a portion thereof, for example, only one side of two or more sides of the semiconductor substrate or even only a portion of a side thereof. An example of a portion of a side is a pattern covering only a portion of a side.

In step (1) of the process of the invention a semiconductor substrate is provided. The semiconductor substrate is an intrinsic or a p-type semiconductor. For example, the semiconductor substrate may be selected from the group consisting of semiconductor substrates of amorphous germanium, semiconductor substrates of amorphous silicon, semiconductor substrates of undoped crystalline germanium, semiconductor substrates of p-doped crystalline germanium, semiconductor substrates of undoped crystalline germanium-silicon alloy and semiconductor substrates of p-doped crystalline germanium-silicon alloy. The semiconductor substrate may in particular be selected from the group consisting of semiconductor substrates of undoped crystalline silicon and semiconductor substrates of p-doped crystalline silicon.

The term "crystalline" used in the description and in the claims means mono- or polycrystalline.

In case of p-type semiconductor substrates the additional doping with aluminum achieved by the process of the invention increases the p-type character of the respective surface area(s) of the p-type semiconductor substrate, or, in other words, the concentration of p-dopant in the respective surface area(s) of the p-type semiconductor substrate is increased.

The aluminum paste applied in step (2) of the process of the invention is an aluminum thick film conductive composition containing particulate aluminum, an organic vehicle and glass frit, wherein the proportion of the glass frit in the aluminum paste is 3 to 20 wt. %, based on total aluminum paste composition.

The particulate aluminum may be aluminum or, in an embodiment, an aluminum alloy with one or more other metals. In case of the aluminum alloys the aluminum content is, for example, 99.7 to below 100 wt. %. The particulate aluminum may include aluminum particles in various shapes, for example, aluminum flakes, spherical-shaped aluminum powder, nodular-shaped (irregular-shaped) aluminum powder or any combinations thereof. Particulate aluminum, in an embodiment, is in the form of aluminum powder. The aluminum powder exhibits an average particle size of, for example, 4 to 10 µm. The particulate aluminum may be present in the aluminum paste in a proportion of 50 to 80 wt. %, or, in an embodiment, 70 to 75 wt. %, based on total aluminum paste composition.

In the description and the claims the term "average particle size" is used. It shall mean the average particle size (mean particle diameter, d50) determined by means of laser light scattering. Laser light scattering measurements can be carried out making use of a particle size analyzer, for example, a Microtrac S3500 machine.

All statements made in the description and the claims in relation to average particle sizes relate to average particle sizes of the relevant materials as are present in the aluminum paste composition.

The aluminum paste includes an organic vehicle. A wide variety of inert viscous materials can be used as organic vehicle. The organic vehicle may be one in which the particulate constituents (particulate aluminum, glass frit) are dispersible with an adequate degree of stability. The properties, in particular, the rheological properties, of the organic vehicle may be such that they lend good application properties to the aluminum paste composition, including: stable dispersion of insoluble solids, appropriate viscosity and thixotropy for application, appropriate wettability of the semiconductor substrate and the paste solids, a good drying rate, and good firing properties. The organic vehicle used in the aluminum paste may be a nonaqueous inert liquid. The organic vehicle may be an organic solvent or an organic solvent mixture; in an embodiment, the organic vehicle may be a solution of organic polymer(s) in organic solvent(s). In an embodiment, the polymer used for this purpose may be ethyl cellulose. Other examples of polymers which may be used alone or in combination include ethylhydroxyethyl cellulose, wood rosin, phenolic resins and poly(meth)acrylates of lower alcohols. Examples of suitable organic solvents include ester alcohols and terpenes such as alpha- or beta-terpineol or mixtures thereof with other solvents such as kerosene, dibutylphthalate, diethylene glycol butyl ether, diethylene glycol butyl ether acetate, hexylene glycol and high boiling alcohols. In addition, volatile organic solvents for promoting rapid hardening after application of the aluminum paste on the semiconductor substrate can be included in the organic vehicle. Various combinations of these and other solvents may be formulated to obtain the viscosity and volatility requirements desired.

The organic solvent content in the aluminum paste may be in the range of 5 to 25 wt. %, or, in an embodiment, 10 to 20 wt. %, based on total aluminum paste composition.

The organic polymer(s) may be present in the organic vehicle in a proportion in the range of 0 to 20 wt. %, or, in an embodiment, 5 to 10 wt. %, based on total aluminum paste composition.

The aluminum paste includes 3 to 20 wt. % or, in an embodiment, 3 to 10 wt. % of glass frit, based on total aluminum paste composition, as inorganic binder. If the glass frit content in the aluminum paste is less than 3 wt. %, process step (4) cannot successfully be carried out; i.e. in such case the fired aluminum paste cannot or not completely be removed with water. Aluminum paste compositions with a glass frit content exceeding the upper limit of 20 wt. % do not possess other required properties; i.e. aluminum pastes containing more than 20 wt. % of glass frit are generally not useful in the process of the invention.

The glass frit has a softening point temperature in the range of, for example, 350 to 600° C. and an average particle size of, for example, 0.5 to 4 µm.

In the description and the claims the term "softening point temperature" is used. It shall mean the glass transition temperature, determined by differential thermal analysis DTA at a heating rate of 10 K/min.

The 3 to 20 wt. % of glass frit may include one glass frit or a combination of two or more different glass frits. There is no special restriction with regard to the composition of the glass frit. In an embodiment, the glass frit is an aluminosilicate glass. In another embodiment, it is a borosilicate glass which may or may not include alkali oxides and/or alkaline earth oxides. The glass frit may contain PbO or it may be leadfree.

Examples of glass frits further include combinations of oxides, such as: $B_2O_3$, $SiO_2$, $Al_2O_3$, CdO, CaO, BaO, ZnO, $Na_2O$, $Li_2O$, PbO, and $ZrO_2$ which may be used independently or in combination to form glass binders.

The preparation of glass frits is well known; the constituents of the glass, in particular in the form of the oxides of the constituents, may be melted together, for example. The batch ingredients may, of course, be any compounds that will yield the desired oxides under the usual conditions of frit production. For example, boric oxide can be obtained from boric acid, barium oxide can be produced from barium carbonate, etc. As is well known in the art, heating may be conducted to a peak temperature in the range of, for example, 1050 to 1250° C. and for a time such that the melt becomes entirely liquid and homogeneous, typically, 0.5 to 1.5 hours. The molten composition is poured into water to form the frit.

The glass may be milled in a ball mill with water or inert low viscosity, low boiling point organic liquid to reduce the particle size of the frit and to obtain a frit of substantially uniform size. It may then be settled in water or said organic liquid to separate fines and the supernatant fluid containing the fines may be removed. Other methods of classification may be used as well.

The aluminum paste may include refractory inorganic compounds and/or metal-organic compounds. "Refractory inorganic compounds" refers to inorganic compounds that are resistant to the thermal conditions experienced during firing. For example, they have melting points above the temperatures experienced during firing. Examples include inorganic oxides, for example, amorphous silicon dioxide. Examples of metal-organic compounds include tin- and zinc-organic compounds such as zinc neodecanoate and tin(II) 2-ethylhexanoate.

The aluminum paste may include one or more organic additives, for example, surfactants, thickeners, rheology modifiers and stabilizers. The organic additive(s) may be part of the organic vehicle. However, it is also possible to add the organic additive(s) separately when preparing the aluminum paste. The organic additive(s) may be present in the aluminum paste in a total proportion of, for example, 0 to 10 wt. %, based on total aluminum paste composition.

The organic vehicle content in the aluminum paste may be dependent on the method of applying the paste and the kind of organic vehicle used, and it can vary. In an embodiment, it may be from 20 to 45 wt. %, or, in an embodiment, it may be in the range of 22 to 35 wt. %, based on total aluminum paste composition. The number of 20 to 45 wt. % includes organic solvent(s), possible organic polymer(s) and possible organic additive(s).

The aluminum paste is a viscous composition, which may be prepared by mechanically mixing the particulate aluminum and the glass frit with the organic vehicle. In an embodiment, the manufacturing method power mixing, a dispersion technique that is equivalent to the traditional roll milling, may be used; roll milling or other mixing technique can also be used.

The aluminum paste can be used as such or may be diluted, for example, by the addition of additional organic solvent(s); accordingly, the weight percentage of all the other constituents of the aluminum paste may be decreased.

In step (2) of the process of the invention, the aluminum paste is applied on at least one surface area of the semiconductor substrate. The aluminum paste may be applied to a dry film thickness of, for example, 15 to 60 μm. The method of aluminum paste application may be printing, for example, silicone pad printing or, in an embodiment, screen printing, or it may be pen-writing. The variety of application methods enables the aluminum paste to be applied to cover the entire surface or only one or more portions thereof. It is possible for example to apply the aluminum paste in a pattern, wherein the pattern may include fine structures like thin lines and dots. If it is desired to apply the aluminum paste in a pattern, there is no need to employ masking means like in conventional p-doping. The application viscosity of the aluminum paste may be, for example, 20 to 200 Pa·s when it is measured at a spindle speed of 10 rpm and 25° C. by a utility cup using a Brookfield HBT viscometer and #14 spindle.

After its application the aluminum paste is dried, for example, for a period of 1 to 100 minutes with the semiconductor substrate reaching a peak temperature in the range of 100 to 300° C. Drying can be carried out making use of, for example, belt, rotary or stationary driers, in particular, IR (infrared) belt driers.

The dried aluminum paste is fired in step (3) of the process of the invention. Firing may be performed, for example, for a period of 1 to 5 minutes with the semiconductor substrate reaching a peak temperature in the range of 700 to 900° C.

Firing can be carried out making use of, for example, single or multi-zone belt furnaces, in particular, multi-zone IR belt furnaces. Firing happens in the presence of oxygen, in particular, in the presence of air.

During firing the organic substance including non-volatile organic material and the organic portion not evaporated during the drying step may be removed, i.e. burned and/or carbonized, in particular, burned. The organic substance removed during firing includes organic solvent(s), possible organic polymer(s), possible organic additive(s) and the organic moieties of possible metal-organic compounds. There is a further process taking place during firing, namely sintering of the glass frit. During firing the temperature exceeds the melting point of aluminum; in the typical case of a silicon semiconductor substrate, an aluminum-silicon melt is formed and, subsequently, during the cooling phase, an epitaxially grown layer of silicon is formed that is p-doped with aluminum, namely an aluminum p-doped surface region of the silicon semiconductor substrate.

Typically, there is no remarkable delay between performing process steps (3) and (4), in particular not when the process of the invention is carried out as an industrial process. For example, process step (4) will typically be carried out immediately after or, for example, within 24 hours after the semiconductor substrate has cooled down after conclusion of process step (3). However, the length of time between performing process steps (3) and (4) is not critical and has no influence on a successful performance of the process of the invention.

In step (4) of the process of the invention the fired aluminum paste is removed with water, or, in other words, by treatment with water. The water temperature may be, for example, 20 to 100° C., or in an embodiment, 25 to 80° C. The treatment with water may take 10 to 120 seconds, for example. The higher the water temperature, the less time step (4) takes. It is surprising that process step (4) can be performed simply with water and without a need to use any further auxiliary chemicals like, for example, acids or bases; this means a considerable advantage not only from an environmental but also from a safety point of view. Surprisingly, it is sufficient to submerge the semiconductor substrate with the fired aluminum paste on its surface into water, although it is also possible to employ other ways of treatment with water, for example, rinsing, spraying or even water jet-spraying. The various methods of treatment with water can also be used in combination. Although there is no need to, it is possible to support the treatment with water by mechanical abrasion, for example, brushing or wiping.

After conclusion of step (4) a semiconductor substrate having at least one aluminum p-doped surface region is obtained. Therefore, the invention relates also to the semiconductor substrate having the at least one aluminum p-doped surface region made by the process of the invention.

While not wishing to be bound by any theory, it is surmised that the 3 to 20 wt. % of glass frit present in the aluminum paste give rise to that during firing all or at least a considerable part of aluminum oxide present on the surface of aluminum particles is consumed by the glass and that aluminum particles are left vulnerable to water attack. It is further surmised that the fired aluminum composition reacts with water resulting in fragility enabling its removal from the aluminum p-doped surface region which remains with the semiconductor substrate.

In the preceding disclosure the invention has been described in its general embodiment. In the following, a particular embodiment of the invention is disclosed.

In the particular embodiment of the process of the invention, the semiconductor substrate provided in step (1) is a p-type solar cell wafer having a p-type region, a front n-type region and a p-n junction, and the at least one surface area of the semiconductor substrate on which the aluminum paste is applied in step (2) is the back-side of the p-type solar cell wafer. Consequently, the process is then a process for the formation of an aluminum p-doped surface region in the form of a BSF layer on the back-side of the p-type solar cell wafer. Thus, in its particular embodiment, the invention relates to a process for the formation of an aluminum p-doped BSF layer on the back side of a p-type solar cell wafer. Accordingly, it relates also to a process for the production of the p-type solar cell wafer itself which has the aluminum p-doped BSF layer.

Therefore, in its particular embodiment, the process of the invention includes the steps:

(1') providing a p-type solar cell wafer having a p-type region, a front n-type region and a p-n junction, (2') applying and drying an aluminum paste on the back-side of the p-type solar cell wafer, (3') firing the applied and dried aluminum paste, and (4') removing the fired aluminum paste with water, wherein the aluminum paste employed in step (2') includes particulate aluminum, an organic vehicle and 3 to 20 wt. % of glass frit, based on total aluminum paste composition.

The p-type solar cell wafer provided in step (1') may, for example, be selected from the group consisting of p-type crystalline germanium solar cell wafers and p-type crystalline germanium-silicon alloy solar cell wafers. The p-type solar cell wafer may in particular be selected from the group consisting of p-type crystalline silicon solar cell wafers.

The production of p-type solar cell wafers having a p-type region, a front n-type region and a p-n junction is known to the person skilled in the art. Reference is made to the section above "Technical Background of the Invention", where the production of such solar cell wafers of the conventional and of the MWT type is described.

The p-type solar cell wafer may already be provided with front-side and/or back-side conductive metal metallizations as explained above in the section "Technical Background of the Invention". However, in a special variant of the particular embodiment of the process of the invention, the p-type solar cell wafer has no back-side metallization.

In step (2') an aluminum paste is applied on the back-side of the p-type solar cell wafer provided in step (1'). The aluminum paste is the same as that used in step (2) of the process of the invention in its general embodiment; to avoid unnecessary repetitions, reference is made to the corresponding disclosure above.

Step (2') may be performed by applying the aluminum paste to those surface portions of the back-side of the p-type solar cell wafer that are not covered by other back-side metallizations like, in particular, back-side silver or silver/aluminum metallizations which may be fired already or not. In case of the special variant of the particular embodiment of the process of the invention, the p-type solar cell wafer is free of any back-side metallizations and the aluminum paste is applied on the entire back-side area of the p-type solar cell wafer, wherein, in case of a MWT solar cell wafer, the aluminum paste is applied such that electrical contact with the metallization of the holes in the wafer is avoided.

The aluminum paste is applied to a dry film thickness of, for example, 15 to 60 μm. The method of aluminum paste application may be printing, for example, silicone pad printing or, in an embodiment, screen printing. The application viscosity of the aluminum paste may be, for example, 20 to 200 Pa·s when it is measured at a spindle speed of 10 rpm and 25° C. by a utility cup using a Brookfield HBT viscometer and #14 spindle.

After its application the aluminum paste is dried, for example, for a period of 1 to 100 minutes with the solar cell wafer reaching a peak temperature in the range of 100 to 300° C. Drying can be carried out making use of, for example, belt, rotary or stationary driers, in particular, IR belt driers.

Then, in step (3'), the dried aluminum paste is fired. Firing may be performed, for example, for a period of 1 to 5 minutes with the solar cell wafer reaching a peak temperature in the range of 700 to 900° C. Firing can be carried out making use of, for example, single or multi-zone belt furnaces, in particular, multi-zone IR belt furnaces. Firing happens in the presence of oxygen, in particular, in the presence of air. During firing the organic substance including non-volatile organic material and the organic portion not evaporated during the drying step may be removed, i.e. burned and/or carbonized, in particular, burned. The organic substance removed during firing includes organic solvent(s), possible organic polymer(s) and possible organic additive(s). There is a further process taking place during firing, namely sintering of the glass frit. Firing may be performed as so-called cofiring together with further metal pastes that have been applied to the p-type solar cell wafer, i.e., front-side and/or back-side conductive metal pastes which have been applied to form front-side and/or back-side electrodes on the wafer's surfaces during the firing process. An embodiment includes front-side silver pastes and back-side silver or back-side silver/aluminum pastes.

During firing the temperature exceeds the melting point of aluminum; in the typical case of a p-type silicon solar cell wafer an aluminum-silicon melt is formed and, subsequently, during the cooling phase, an epitaxially grown layer of silicon is formed that is p-doped with aluminum, namely an aluminum p-doped BSF layer.

Typically, there is no remarkable delay between performing process steps (3') and (4'), in particular not when the process of the invention in its particular embodiment is carried out as an industrial process. For example, process step (4') will typically be carried out immediately after or, for example, within 24 hours after the solar cell wafer has cooled down after conclusion of process step (3'). However, the length of time between performing process steps (3') and (4') is not critical and has no influence on a successful performance of the particular embodiment of the process of the invention.

In step (4') the fired aluminum composition is removed with water. To avoid unnecessary repetitions reference is made to the disclosure in connection with the description of step (4) of the general embodiment of the process of the invention.

After conclusion of step (4') a p-type solar cell wafer having an aluminum p-doped BSF layer is obtained. Therefore, the invention relates also to said p-type solar cell wafer made by the process of the invention in its particular embodiment. The p-type solar cell wafer made by the process of the invention in its particular embodiment exhibits no or almost negligible warpage.

While not wishing to be bound by any theory, it is surmised that the 3 to 20 wt. % of glass frit present in the aluminum paste give rise to that during firing all or at least a considerable part of aluminum oxide present on the surface of aluminum particles is consumed by the glass and that aluminum particles are left vulnerable to water attack. It is further surmised that the fired aluminum composition reacts with water resulting in fragility enabling its removal from the aluminum-doped BSF layer which remains with the solar cell wafer.

In case of the special variant of the particular embodiment of the process of the invention a subsequent step (5') of forming a back-side conductive metal anode or, in case of a MWT solar cell wafer, anodic conductive metal back collector contacts is performed.

To this end, a back-side conductive metal paste, typically a silver or silver/aluminum paste is applied, for example, screen printed and successively dried on the aluminum-doped BSF layer on the back-side of the p-type solar cell wafer. The back-side conductive metal paste is applied, for example, as two parallel busbars or as rectangles (tabs) ready for soldering interconnection strings (presoldered copper ribbons), or, in case of a MWT solar cell wafer, as anodic conductive metal back collector contacts.

After its application the back-side conductive metal paste is dried, for example, for a period of 1 to 100 minutes with the wafer reaching a peak temperature in the range of 100 to 300° C. Drying can be carried out making use of, for example, belt, rotary or stationary driers, in particular, IR belt driers.

The dried back-side conductive metal paste is then fired to become a conductive metal back anode or anodic conductive metal back collector contacts. Firing may be performed, for example, for a period of 1 to 5 minutes with the wafer reaching a peak temperature in the range of 700 to 900° C. Firing can be carried out making use of, for example, single or multi-zone belt furnaces, in particular, multi-zone IR belt furnaces.

Recently, the so-called "SLIM-cut" process for the manufacture of ultra-thin (~50 μm) crystalline silicon wafers has been disclosed (F. Dross et al., "Stress-Induced Lift-Off Method for kerf-loss-free wafering of ultra-thin crystalline Si wafers", Photovoltaic Specialists Conference, 2008, ISBN 978-1-4244-1640-0). Here, a metal layer with mismatched coefficient of thermal expansion is deposited on a thick silicon substrate and heated. Upon cooling, the differential contraction induces a large stress field, which is released by the initiation and the propagation of a crack parallel to the surface. The metal can then be removed from the so obtained bimetallic substrate by treating it with an appropriate etching chemical. If the aluminum paste applied in step (2) of the process of the invention were used in said "SLIM-cut" process to deposit the metal layer with mismatched coefficient of thermal expansion there would be no need for employing etching chemicals; rather the principle of the present invention could be used and the etching chemical be replaced simply by water, i.e. the removal of the metal (here aluminum) could be performed by treatment simply with water.

What is claimed is:

1. A process for the formation of at least one aluminum p-doped surface region of a semiconductor substrate comprising the steps:
   (1) providing a semiconductor substrate,
   (2) applying and drying an aluminum paste on at least one surface area of the semiconductor substrate,
   (3) firing the dried aluminum paste, and
   (4) removing the fired aluminum paste with water,
   wherein the aluminum paste employed in step (2) includes particulate aluminum, an organic vehicle and 3 to 20 wt. % of glass frit, based on total aluminum paste composition, wherein firing is carried out in a belt furnace for a period of 1 to 5 minutes with the wafer reaching a peak temperature in the range of 700 to 900° C.

2. The process of claim 1, wherein the semiconductor substrate is selected from the group consisting of semiconductor substrates of amorphous germanium, semiconductor substrates of amorphous silicon, semiconductor substrates of undoped crystalline germanium, semiconductor substrates of p-doped crystalline germanium, semiconductor substrates of undoped crystalline germanium-silicon alloy, semiconductor substrates of p-doped crystalline germanium-silicon alloy, semiconductor substrates of undoped crystalline silicon and semiconductor substrates of p-doped crystalline silicon.

3. The process of claim 1, wherein the semiconductor substrate is a p-type solar cell wafer having a p-type region, a front n-type region and a p-n junction, and wherein the at least one surface area of the semiconductor substrate is the back-side of the p-type solar cell wafer.

4. The process of claim 3, wherein the p-type solar cell wafer is selected from the group consisting of p-type crystalline germanium solar cell wafers, p-type crystalline germanium-silicon alloy solar cell wafers and p-type crystalline silicon solar cell wafers.

5. The process of claim 1, wherein the particulate aluminum is present in the aluminum paste in a proportion of 50 to 80 wt. %, based on total aluminum paste composition.

6. The process of claim 1, wherein the glass frit is an aluminosilicate glass or a borosilicate glass.

7. The process of claim 1, wherein the organic vehicle content in the aluminum paste is 20 to 45 wt. %, based on total aluminum paste composition.

8. A semiconductor substrate having at least one aluminum p-doped surface region made by the process of claim 1, wherein the aluminum p-doped surface region penetrates the surface in the respective area only to a certain penetration depth in the range of, 500 to 4000 nm, in particular, 3000 to 4000 nm, forming the aluminum p-doped surface region in the respective area, wherein the aluminum p-doped region does not penetrated throughout the entire semiconductor substrate.

9. The process of claim 3, wherein the particulate aluminum is present in the aluminum paste in a proportion of 50 to 80 wt. %, based on total aluminum paste composition.

10. The process of claim 3, wherein the glass frit is an aluminosilicate glass or a borosilicate glass.

11. The process of claim 3, wherein the organic vehicle content in the aluminum paste is 20 to 45 wt. %, based on total aluminum paste composition.

12. A p-type solar cell wafer having an aluminum p-doped BSF layer made by the process of claim 3.

* * * * *